(12) United States Patent
Lee

(10) Patent No.: US 10,634,306 B2
(45) Date of Patent: Apr. 28, 2020

(54) VEHICLE LAMP USING SEMICONDUCTOR LIGHT EMITTING DEVICE

(71) Applicant: LG ELECTRONICS INC., Seoul (KR)

(72) Inventor: Sungwhan Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 269 days.

(21) Appl. No.: 15/499,002

(22) Filed: Apr. 27, 2017

(65) Prior Publication Data

US 2018/0313514 A1    Nov. 1, 2018

(51) Int. Cl.
| | |
|---|---|
| *B60Q 1/44* | (2006.01) |
| *B60Q 1/34* | (2006.01) |
| *F21S 43/19* | (2018.01) |
| *F21S 43/20* | (2018.01) |
| *F21S 43/14* | (2018.01) |
| *B60Q 1/26* | (2006.01) |
| *F21S 43/15* | (2018.01) |
| *F21S 43/145* | (2018.01) |
| *H01L 25/075* | (2006.01) |
| *H01L 33/50* | (2010.01) |

(52) U.S. Cl.
CPC .......... *F21S 43/195* (2018.01); *B60Q 1/2607* (2013.01); *F21S 43/14* (2018.01); *F21S 43/145* (2018.01); *F21S 43/15* (2018.01); *F21S 43/255* (2018.01); *H01L 25/0753* (2013.01); *H01L 33/504* (2013.01)

(58) Field of Classification Search
CPC .... B60Q 1/44; B60Q 1/34; B60Q 1/30; F21Y 2115/10; F21Y 2115/15; F21S 43/195; F21S 43/255; F21S 43/14; H01L 27/156
USPC .......................................................... 315/77
See application file for complete search history.

(56) References Cited

U.S. PATENT DOCUMENTS

| | | | | |
|---|---|---|---|---|
| 2012/0262643 | A1* | 10/2012 | Kweon ................ | G02B 6/0091 349/58 |
| 2015/0308671 | A1* | 10/2015 | Tischler ................. | H01S 5/042 362/235 |
| 2015/0360606 | A1* | 12/2015 | Thompson ............ | B60Q 3/252 362/490 |

* cited by examiner

*Primary Examiner* — Dedei K Hammond
*Assistant Examiner* — Amy X Yang
(74) *Attorney, Agent, or Firm* — Birch, Stewart, Kolasch & Birch, LLP

(57) ABSTRACT

The present invention relates to a vehicle lamp, specifically, a vehicle lamp using a semiconductor light emitting device. A vehicle lamp according to the present invention includes a light source unit to emit light, and the light source unit includes a wiring board, a plurality of semiconductor light emitting devices arranged on one surface of the wiring board, a first wiring electrically connected to a first group including a part of the semiconductor light emitting devices and disposed on the one surface of the wiring board, a second wiring electrically connected to a second group including another part of the semiconductor light emitting devices and extending to another surface of the wiring board through via holes formed through the wiring board, and a third wiring electrically connected to the semiconductor light emitting devices included in the first and second groups and forming a common electrode.

11 Claims, 8 Drawing Sheets

VEHICLE LAMP USING SEMICONDUCTOR LIGHT EMITTING DEVICE

BACKGROUND OF THE INVENTION

1. Field of the Invention

This specification relates to a vehicle lamp (or car lamp), and more particularly, a vehicle lamp using a semiconductor light emitting device.

2. Background of the Invention

A vehicle is equipped with various lamps having lighting functions and signaling functions. In general, halogen lamps or gas discharge lamps are usually used, but in recent years, light emitting diodes (LEDs) are in the spotlight as light sources for vehicle lamps.

The LED can enhance a degree of freedom for design of a lamp by minimizing a size thereof and exhibit economical efficiency by virtue of a semi-permanent lifespan, but most of the LEDs are currently produced in a form of a package. The LED itself other than the package is under development as a semiconductor light emitting device of converting a current into light, namely, an image displaying light source equipped in an electronic device such as an information communication device.

Vehicle lamps ever developed use the LEDs in the package form and thereby have disadvantages, such as a low mass production yield rate, high fabrication costs and low flexibility.

Therefore, attempts to apply a surface light source fabricated using the semiconductor light emitting device itself other than the package type to the vehicle lamp are currently undergoing.

Meanwhile, the vehicle lamp may have various shapes and also the attempt to apply the surface light source to the vehicle lamp having the various shapes is actively made.

However, to drive semiconductor light emitting devices in an individual manner, a separate wiring pattern, specifically, a wiring electrode is required. This causes a limit in a degree of design freedom.

SUMMARY OF THE INVENTION

Therefore, an aspect of the detailed description is to provide a vehicle lamp (or car lamp) which uses a surface light source configured as a semiconductor light emitting device and has various shapes.

Another aspect of the detailed description is to provide a vehicle lamp capable of driving semiconductor light emitting devices in an individual manner while enhancing a degree of design freedom.

Another aspect of the detailed description is to provide a vehicle lamp capable of being variously designed while providing a plurality of colors of light.

To achieve these and other advantages and in accordance with the purpose of this specification, as embodied and broadly described herein, there is provided a vehicle lamp provided with a light source unit to emit light. The light source unit may include a wiring board, a plurality of semiconductor light emitting devices arranged on one surface of the wiring board, a first wiring electrically connected to a first group including a part of the semiconductor light emitting devices and disposed on the one surface of the wiring board, a second wiring electrically connected to a second group including another part of the semiconductor light emitting devices and extending to another surface of the wiring board through via holes formed through the wiring board, and a third wiring electrically connected to the semiconductor light emitting devices included in the first and second groups and forming a common electrode.

In an embodiment disclosed herein, the first wiring may form a surface electrode on the one surface of the wiring board, and the surface electrode may be provided with through holes corresponding to the via holes.

In an embodiment disclosed herein, the semiconductor light emitting to devices included in the second group may be arranged in the through holes to be electrically connected to the second wiring.

In an embodiment disclosed herein, each of the semiconductor light emitting devices included in the first and second groups may include first and second conductive semiconductor layers, an active layer formed between the first and second conductive semiconductor layers, a first conductive electrode formed on one surface of the first conductive semiconductor layer, and a second conductive electrode formed on one surface of the second conductive semiconductor layer. The second conductive semiconductor layer may be provided with one surface and another surface, such that the second conductive electrode is formed on the one surface and the active layer is formed on the another surface. The first conductive electrode of each of the semiconductor light emitting devices included in the first group may be electrically connected to the first wiring, and the first conductive electrode of each of the semiconductor light emitting devices included in the second group may be electrically connected to the second wiring.

In an embodiment disclosed herein, the second conductive electrode of each of the semiconductor light emitting devices included in the first and second groups may be electrically connected to the third wiring forming the common electrode.

In an embodiment disclosed herein, the semiconductor light emitting devices included in the first and second groups may form a plurality of rows in one direction, and the third wiring may be provided with a plurality of electrode lines formed to cover at least parts of the second conductive electrodes of the semiconductor light emitting devices included in the first and second groups, and extending along the one direction.

In an embodiment disclosed herein, the light source unit may further include a phosphor layer formed to cover the semiconductor light emitting devices included in the first and second groups and configured to convert colors of light emitted from the semiconductor light emitting devices included in the first and second groups. Each of the semiconductor light emitting devices included in the first group may be provided with a first phosphor portion stacked thereon and configured to convert a color of light emitted from the semiconductor light emitting device into a first color, and each of the semiconductor light emitting devices included in the second group may be provided with a second phosphor portion stacked thereon and configured to convert a color of light emitted from the semiconductor light emitting device to a second color different from the first color.

In an embodiment disclosed herein, the light source unit may further include a black matrix disposed between the first and second phosphor portions, and the black matrix may be formed to cover at least part of the first wiring.

In an embodiment disclosed herein, the semiconductor light emitting devices included in the first and second groups may be sequentially arranged alternately along a row direction and a column direction.

In an embodiment disclosed herein, the light source unit may further include a black matrix surrounding peripheries of the semiconductor light emitting devices included in the first and second groups.

In an embodiment disclosed herein, the semiconductor light emitting devices included in the first group and the semiconductor light emitting devices included in the second group may be arranged in one direction to form a plurality of lines. A first line formed by the semiconductor light emitting devices included in the first group and a second line formed by the semiconductor light emitting devices included in the second group may sequentially intersect with each other.

In an embodiment disclosed herein, the light source unit may further include a black matrix formed between the first line formed by the semiconductor light emitting devices included in the first group and the second line formed by the semiconductor light emitting devices included in the second group.

In an embodiment disclosed herein, the another surface of the wiring board may include a first region covered with the second wiring and a second region without being covered with the second wiring, and the second region may be at least one edge region of the wiring board.

In an embodiment disclosed herein, the first wiring may extend from the one surface of the wiring board to cover at least part of the second region.

In an embodiment disclosed herein, the light source unit may further include a controller configured to control driving of the semiconductor light emitting devices included in the first and second groups. The controller may selectively turn on the semiconductor light emitting devices included in the first and second groups according to a stop mode, tail mode and turn mode of the vehicle.

As described above, according to a vehicle lamp of the present invention, semiconductor light emitting devices provided on one surface of a wiring board can be selectively connected to different wirings provided on both surfaces of the wiring board, respectively, thereby driving the semiconductor light emitting devices on the same surface in a two-channel manner. Therefore, according to the present invention, a vehicle lamp which can realize a plurality of colors of light on the same surface can be provided.

Further, according to a vehicle lamp of the present invention, wirings for electrically connecting semiconductor light emitting devices included in different groups to one surface and another surface of a wiring board, and the wiring provided on the another surface of the wiring board can be connected to the semiconductor light emitting devices through via holes. Therefore, the wirings can be simplified even without realizing a separate wiring pattern for the semiconductor light emitting devices included in different groups.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings:

FIG. 1B is an enlarged view illustrating a state that the rear lamp of FIG. 1A is turned on;

DETAILED DESCRIPTION OF THE INVENTION

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that when an element such as a layer, area or substrate is referred to as being "on" another element, it can be directly on the element, or one or more intervening elements may also be present.

A vehicle lamp described in this specification may include a head lamp, a tail lamp, a position lamp, a fog lamp, a turn signal lamp, a brake lamp, an emergency lamp, a backup lamp, and the like. However, it will be readily apparent to those skilled in the art that the configuration according to the embodiments described herein may also be applied to a new product type that will be developed later if the device is a device capable of emitting light.

Figure 1A:
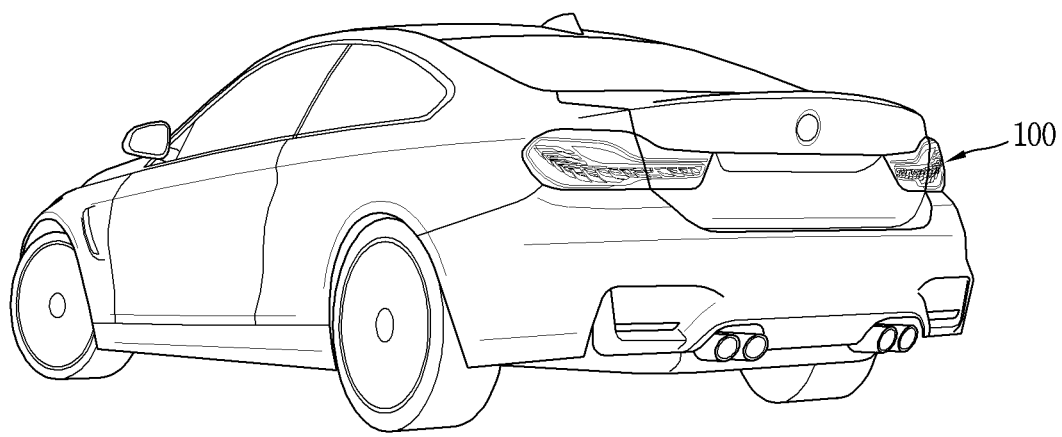
FIG. 1A is a conceptual view illustrating a rear lamp as one embodiment of a vehicle lamp.
Figure 1B:
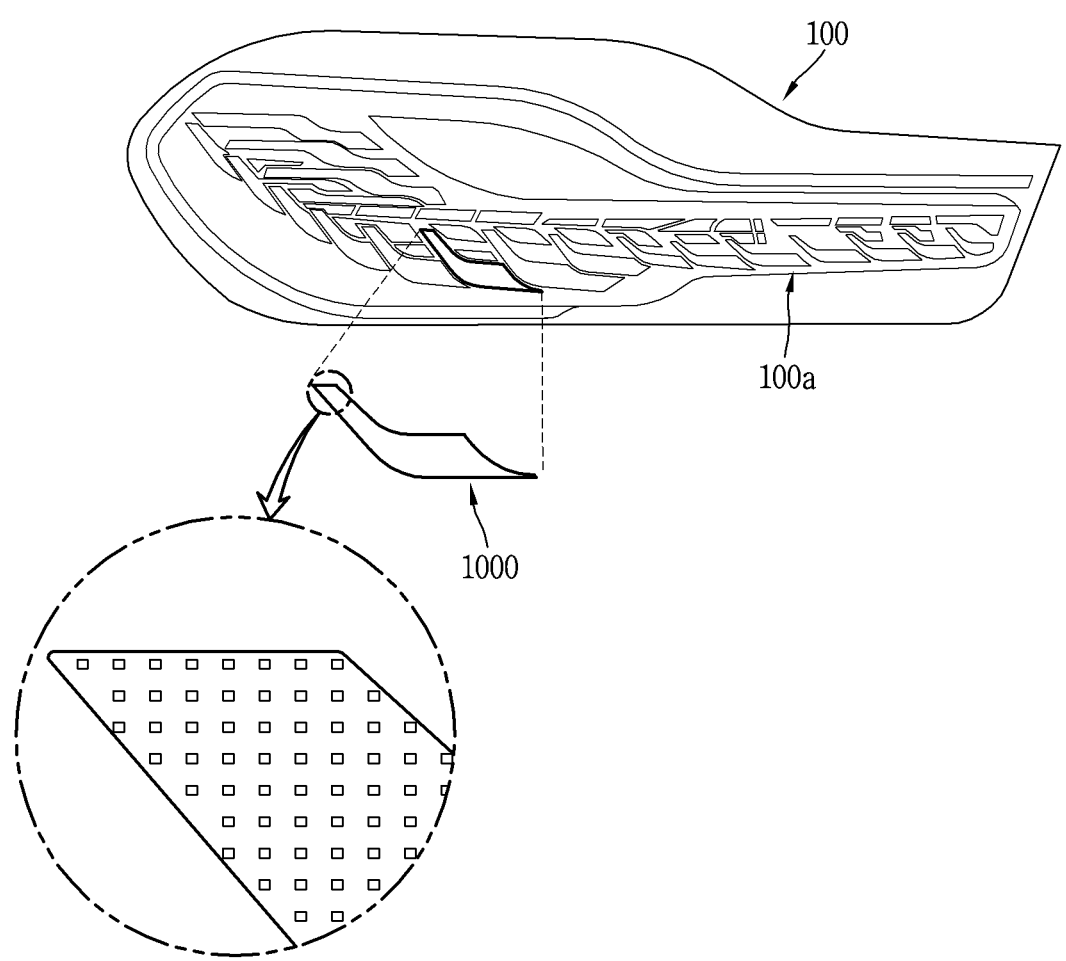

FIG. 1A is a conceptual view illustrating a rear lamp as one embodiment of a vehicle lamp, and FIG. 1B is an enlarged view illustrating a state in which the rear lamp of FIG. 1A is turned on.

Referring to FIG. 1A, a rear lamp 100 of a vehicle is disposed on each of both sides of a rear surface of the vehicle, thereby forming rear appearance of the vehicle.

The rear lamp 100 may be a lamp in which a tail lamp, a turn signal lamp, a brake lamp, an emergency lamp, and a backup lamp are combined in a package form. That is, the rear lamp 100 includes a plurality of lamps selectively emitting light according to the control of the vehicle.

In this instance, at least one of the plurality of lamps may be configured to emit light in a preset shape. As one example, a brake lamp 100a may be formed long in a horizontal direction and have at least part curved in a vertical direction, such that light is emitted in a shape corresponding to the shape of the brake lamp 100a. In addition, the brake lamp 100a may be bent toward the front of the vehicle. Such three-dimensional complex shape may be realized by a plurality of light emitting regions.

Referring to FIG. 1B, the preset shape is realized by combining light emitting regions with different shapes.

A light source unit 1000 implemented by a semiconductor light emitting device may be disposed on the light emitting region. The light source unit 1000 may be fixed to a vehicle body through a frame, and a wiring line for supplying power to the light source unit 1000 may be connected to the frame.

The light source unit may be a flexible light source unit that can be curved, bent, twisted, folded or rolled by an external force. The light source unit may also be a surface light source having a light emitting surface corresponding to the light emitting region.

In this instance, the light source unit 1000 may be provided in plurality to be arranged on the light emitting regions, respectively, or be configured as a single light emitting unit so as to realize the entire preset shape.

A pixel of the light source unit 1000 may be implemented by a semiconductor light emitting device. In the present invention, a light emitting diode (LED) is exemplarily employed as one type of semiconductor light emitting device for converting a current into light. The LED may be a light emitting device having a size ranging from several to several tens of micrometers, and may serve as a pixel on the three-dimensional space.

Hereinafter, the light source unit according to the present invention will be described in more detail. The light source unit disclosed herein may include a wiring board, a plurality of semiconductor light emitting devices arranged on one surface of the wiring board, a first wiring electrically connected to a first group including a part of the semiconductor light emitting devices and arranged on the one surface of the wiring board, a second wiring electrically connected to a second group including another part of the semiconductor light emitting devices and extending to another surface of the wiring board through via holes formed through the wiring board, and a third wiring electrically connected to the semiconductor light emitting devices included in the first and second groups and forming a common electrode.

The present invention is to provide a vehicle lamp capable of individually driving semiconductor light emitting devices with enhancing a degree of design freedom, which will be described in more detail hereinafter, with reference to the accompanying drawings.

Figure 2:
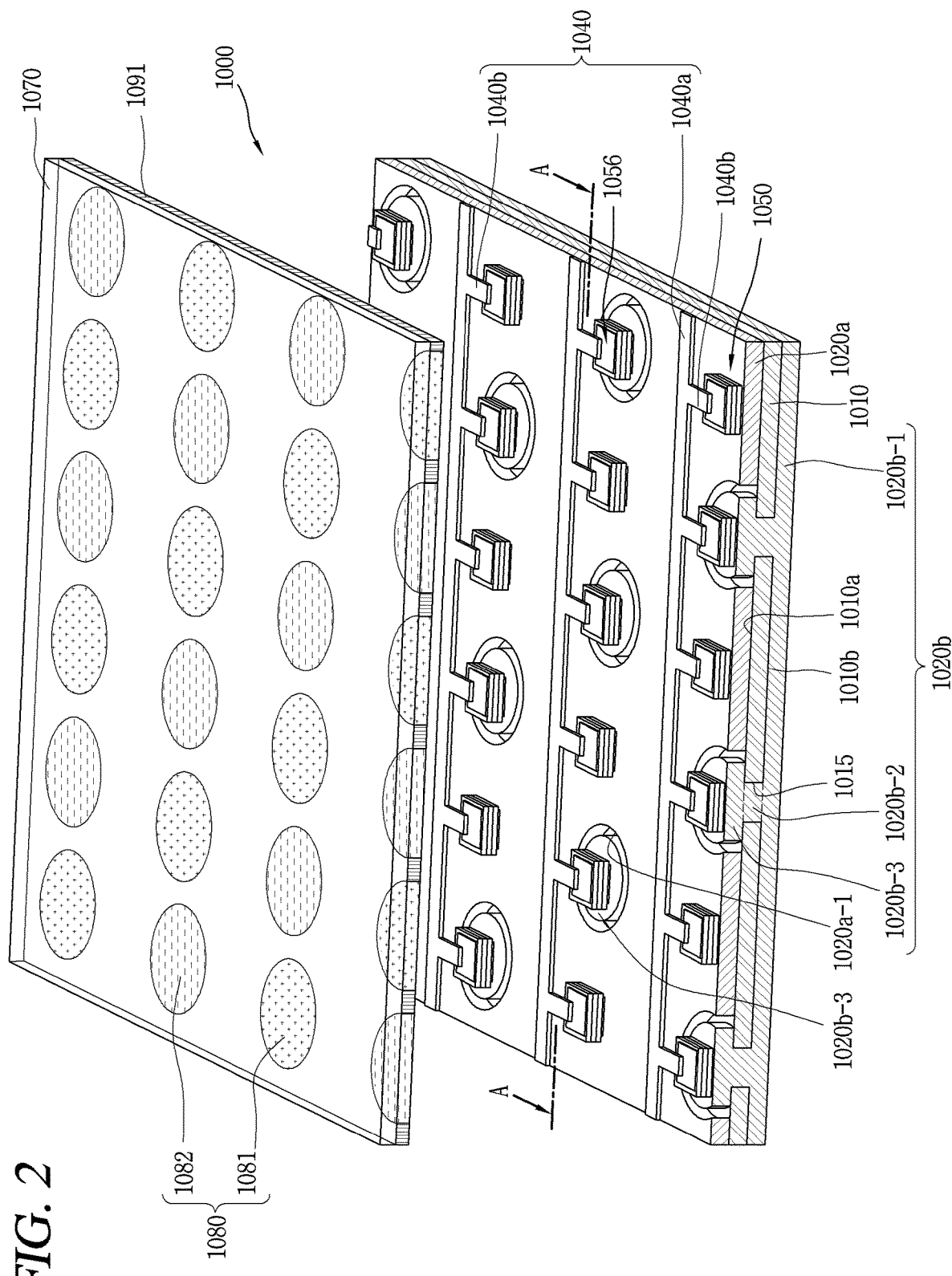
FIG. 2 is a perspective view illustrating a light source unit of the vehicle lamp in accordance with the present invention.
Figure 3:
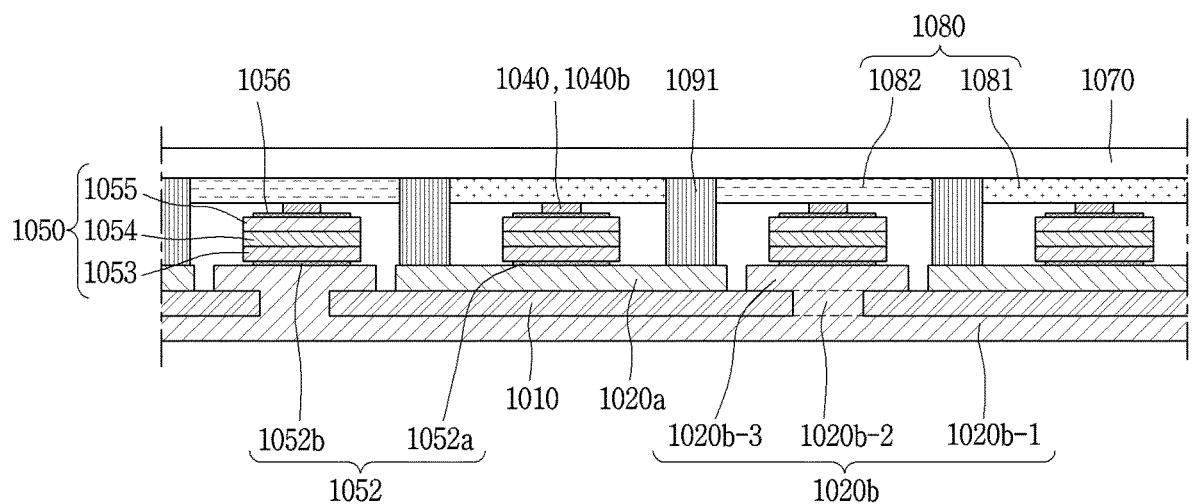
FIG. 3 is a sectional view of the light source unit of the vehicle lamp, taken along the line A-A of FIG. 2.
Figure 4:
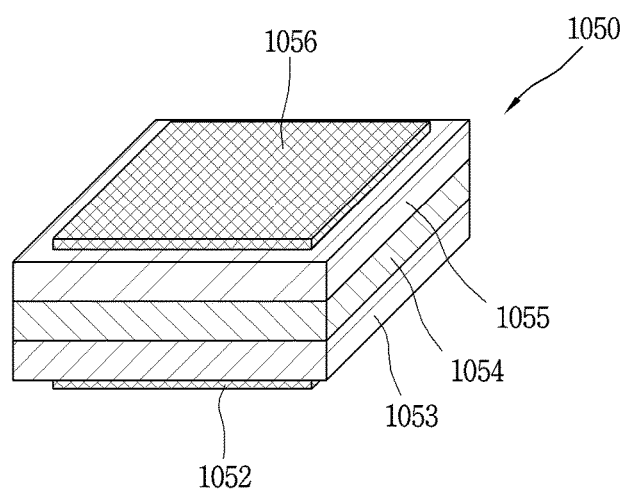
FIG. 4 is a conceptual view illustrating a phosphor portion provided in the light source unit of the vehicle lamp in accordance with the present invention.
Figure 5:
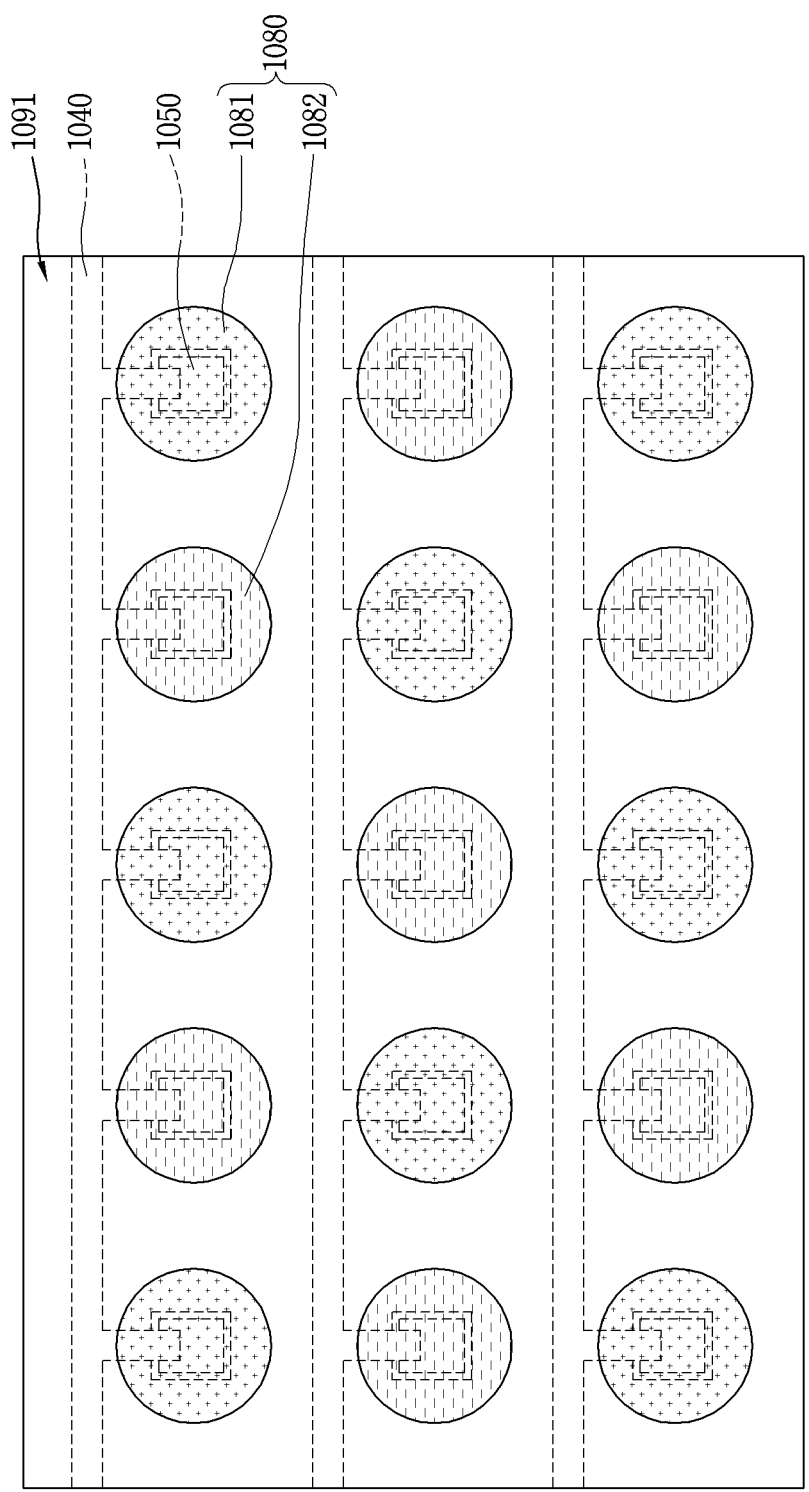
FIG. 5 is a conceptual view illustrating semiconductor light emitting devices provided in the light source unit in accordance with the present invention.

FIG. 2 is a perspective view illustrating a light source unit of a vehicle lamp in accordance with the present invention, FIG. 3 is a sectional view of the light source unit of the vehicle lamp, taken along the line A-A of FIG. 2, FIG. 4 is a conceptual view illustrating a semiconductor light emitting device provided in the light source unit of the vehicle lamp in accordance with the present invention, and FIG. 5 is a conceptual view illustrating semiconductor light emitting devices provided in the light source unit in accordance with the present invention.

As illustrated, a light source unit 1000 of a vehicle lamp disclosed herein may include a wiring board 1010, a plurality of semiconductor light emitting devices 1050 arranged on one surface of the wiring board, a first wiring 1020a electrically connected to a first group including a part of the semiconductor light emitting devices 1050 and arranged on the one surface of the wiring board 1010, a second wiring 1020b, 1020b-1, 1020b-2, 1020b-3 electrically connected to a second group including another part of the semiconductor light emitting devices 1050 and extending to another surface of the wiring board 1010 through via holes 1015 formed through the wiring board 1010, and a third wiring 1040, 1040a, 1040b electrically connected to the semiconductor light emitting devices 1050 included in the first and second groups and forming a common electrode.

The wiring board 1010 may be made of various materials. The wiring board 1010 may be flexible or inflexible.

When the wiring board 1010 is flexible, the wiring board 1010 may contain glass or polyimide (PI). The wiring board 1010 may also use any material, for example, polyethylene naphthalate (PEN), polyethylene terephthalate (PET) and the like, if the material has an insulating property and flexibility. Also, the wiring board 1010 may be made of any of a transparent material or an opaque material. In addition, as illustrated, the wiring board 1010 may be provided with through holes or via holes 1015. Each of the via holes 1015 formed through the wiring board 1010 forms a physical path through which at least part of the semiconductor light emitting device is electrically connectable to the second wiring 1020b.

In addition, the first wiring 1020a may be disposed on one surface 1010a of the wiring board 1010. The first wiring 1020a may be implemented as a surface electrode that covers at least part of the one surface 1010a of the wiring board 1010. On the contrary, the first wiring 1020a may be implemented as a conductive film that covers at least part of the one surface 1010a of the wiring board 1010.

As illustrated, the first wiring 1020a may be electrically connected to at least part (some) of the semiconductor light emitting devices 1050 arranged on the one surface 1010a of the wiring board 1020a. In addition, through holes 1020a-1 that are formed at positions corresponding to the positions of the via holes 1015 of the wiring board 1010 may be formed through the first wiring 1020a.

In more detail, the first wiring 1020a, as illustrated, may be provided with the through holes 1020a-1 each of which has an inner diameter greater than that of the via hole 1015 of the wiring board 1010 and overlaps the via hole 1015.

The inner diameter of the through hole 1020a-1 of the first wiring 1020a may be greater than that of the via hole 1015 of the wiring board 1010. The first wiring 1020a may be stepped with respect to the wiring board 1010 at the position where the through hole 1020a-1 is formed.

Next, the second wiring 1020b may be disposed on another surface 1010b that is opposite to the one surface 1010a of the wiring board 1010 with the first wiring 1020a. The second wiring 1020b may be implemented as a surface electrode that covers at least part of the another surface 1010b of the wiring board 1010. On the contrary, the second wiring 1020b may be implemented as a conductive film that covers at least part of the another surface 1010b of the wiring board 1010.

The second wiring 1020b is electrically connected to at least part of the semiconductor light emitting device disposed on the one surface of the wiring board 1010. To this end, the second wiring 1020b may include a base wiring 1020b-1 disposed on the another surface 1010b of the wiring board 1010, auxiliary electrodes 1020b-2 electrically connected to the base wiring 1020b-1 and inserted through the via holes 1015 of the wiring board 1010 and the through holes 1020a-1 of the first wiring 1020a, respectively, and electrode pads 1020b-3 electrically connected to the auxiliary electrodes 1020b-2 and physically brought into contact with the semiconductor light emitting devices.

Each of the auxiliary electrodes 1020b-2 is an electrode by which the base wiring 1020b-1 of the second wiring 1020b is electrically connected to the semiconductor light emitting device 1050. The auxiliary electrode 1020b-2 is located to correspond to the positions of the via hole 1015 of the wiring board 1010 and the through hole 1020a-1 of the first wiring 1020a. The auxiliary electrode 1020b-2 may have a dot-like shape.

In addition, each of the electrode pads 1020b-3 may be disposed at a position corresponding to the position where the via hole 1015 of the wiring board 101 and the through hole 1020a-1 of the first wiring 1020a are formed, and thus overlaps at least part of the first wiring 1020a.

The electrode pad 1020b-3 may have an inner diameter or length smaller than the inner diameter of the through hole 1020a-1 of the first wiring 1020a, so as to be prevented from electrically colliding with the first wiring 1020a. An insulating material may be filled between the electrode pad 1020b-3 and the through hole 1020a-1 of the first wiring 1020a.

Meanwhile, a height of the electrode pad 1020b-3 may be the same as or similar to a height corresponding to the step formed between the first wiring 1020a and the wiring board 1010. The first wiring 1020a and the electrode pad 1020b-3 may be flush with each other. In more detail, an upper surface of the first wiring 1020a and an upper surface of each electrode pad 1020b-3 may form the same plane. Therefore, the semiconductor light emitting devices arranged on the one surface of the wiring board may seem to be arranged on the same plane.

As such, the first and second wirings 1020a and 1020b may be disposed on the one surface 1010a and the another surface 1010b of the wiring board 1010, respectively. A part (some) of the semiconductor light emitting devices 1050 arranged on the one surface 1010a of the wiring board 1010 may be electrically connected to the first wiring 1020a, and another part of the semiconductor light emitting devices 1050 may be electrically connected to the second wiring 1020b.

In this specification, the part of the semiconductor light emitting devices electrically connected to the first wiring 1020a is referred to as being included in a first group, and the another part of the semiconductor light emitting devices electrically connected to the second wiring 1020b is referred to as being included in a second group.

As illustrated, the semiconductor light emitting devices included in the first group are arranged at a region excluding a region where the through holes 1020a-1 of the first wiring 1020a are formed, and electrically connected to the first wiring 1020a. The semiconductor light emitting devices included in the second group are arranged in the through holes 1020a-1, respectively, and electrically connected to the second wiring 1020b through an electric connection path formed by the electrode pad 1020b-3, the auxiliary electrode 1020b-2 and the base wiring 1020b-1.

Meanwhile, each of the semiconductor light emitting devices included in the first and second groups, as illustrated in FIG. 4, may include first and second conductive semiconductor layers 1053 and 1055, an active layer 1054 formed between the first and second conductive semiconductor layers 1053 and 1055, a first conductive electrode 1052 formed on one surface of the first conductive semiconductor layer 1053, and a second conductive electrode 1056 formed on one surface of the second conductive semiconductor layer 1055.

In addition, the first conductive semiconductor layer 1053 is provided with one surface and another surface. The first conductive electrode 1052 is formed on the one surface, and the active layer 1054 is formed on the another surface.

Similarly, the second conductive semiconductor layer 1055 is provided with one surface and another surface. The second conductive electrode 1056 is formed on the one surface, and the active layer 1054 is formed on the another surface.

As such, the semiconductor light emitting devices constructing the vehicle lamp according to the present invention may be implemented as vertical semiconductor light emitting devices.

In each semiconductor light emitting device having such structure, as illustrated in FIG. 3, a first conductive electrode 1052a of each of the semiconductor light emitting devices included in the first group may be electrically connected to the first wiring 1020a, and a first conductive electrode 1052b of each of the semiconductor light emitting devices included in the second group may be electrically connected to the second wiring 1020b.

Here, the first conductive electrode 1052a of each of the semiconductor light emitting devices included in the first group may be referred to as the first conductive electrode 1052a of the first group. and the first conductive electrode 1052b of each of the semiconductor light emitting devices included in the first group may be referred to as the first conductive electrode 1052b of the second group.

In this manner, the semiconductor light emitting devices included in the different groups may be electrically connected to the different wirings so as to be independently driven, even though having the same polarity.

Therefore, in the vehicle lamp disclosed herein, the first and second wirings may be driven in the independent or individual manner, and accordingly, the semiconductor light emitting devices included in the first group and the semiconductor light emitting devices included in the second group can be driven independently.

Meanwhile, the second conductive electrodes 1056 of the semiconductor light emitting devices included in the first and second groups are electrically connected to the third wiring 1040 forming the common electrode.

Hereinafter, the third wiring 1040 will be described in more detail. As illustrated in FIG. 2, the semiconductor light emitting devices included in the first and second groups may form a plurality of rows in one direction. The third wiring 1040 may be provided with a plurality of electrode lines that cover at least parts of the second conductive electrodes of the semiconductor light emitting devices included in the first and second groups and extend in the one direction.

The third wiring 1040 may further include connection electrodes 1040b that extend from the plurality of electrode lines and cover at least parts of the second conductive electrodes 1056 of the semiconductor light emitting devices included in the first and second groups.

In the present invention, the third wiring can serve as a common electrode electrically connected to all of the semiconductor light emitting devices arranged on the one surface of the wiring board 1010, irrespective of the groups of the semiconductor light emitting devices to which they belong.

Meanwhile, the arrangement of the semiconductor light emitting devices included in the first and second groups may be varied in various manners.

In one example, as illustrated, the semiconductor light emitting devices included in the first and second groups may sequentially be arranged alternately along row and column directions.

In this instance, the through holes formed at the wiring board 1010 and the first wiring 1020*a* may also sequentially be located alternately along the row and column directions.

As such, when the semiconductor light emitting devices included in the first and second groups are sequentially arranged alternately along the row and column directions, a group including one semiconductor light emitting device is different from another group, in which semiconductor light emitting devices neighboring in upper, lower, left and right direction are included.

Meanwhile, in the vehicle lamp according to the present invention, phosphor layers may be selectively deposited so that light of a different color can be emitted for each group.

More specifically, as illustrated in FIGS. 2, 3 and 5, a phosphor layer 1080 may be located on an outer surface of each of the semiconductor light emitting devices 1050. For example, the semiconductor light emitting device 1050 is a blue semiconductor light emitting device that emits blue (B) light, and the phosphor layer 1080 executes a function of converting the blue (B) light into light of a specific color.

In the vehicle lamp according to the present invention, a different phosphor material for converting light output from the semiconductor light emitting device into light of a different color may be coated on one surface of each of the semiconductor light emitting devices included in the respective groups, such that the semiconductor light emitting devices included in the first and second groups can emit light of different colors.

The phosphor layers 1080 are provided to cover the semiconductor light emitting devices included in the first and second groups and to convert a color of light emitted from each of the semiconductor light emitting devices included in the first and second groups.

A first phosphor portion 1081 for converting light emitted from each of the semiconductor light emitting devices included in the first group into light of a first color may be stacked on each of the semiconductor light emitting devices included in the first group. A second phosphor portion 1082 for converting light emitted from each of the semiconductor light emitting devices included in the second group into light of a second color different from the first color may be stacked on each of the semiconductor light emitting devices included in the second group.

As described above, the semiconductor light emitting devices included in the first and second groups may be sequentially disposed alternately along the row and column directions. In this instance, as illustrated in FIG. 5, the phosphor materials having different color conversion characteristics may allow a group including one semiconductor light emitting device to generate a color different from colors of light emitted from the semiconductor light emitting devices which are neighboring to one another in upper, lower, left and right directions.

In addition, a barrier wall 1091 may be further provided between the first and second phosphor portions 1081 and 1082 and between the semiconductor light emitting devices 1050. The barrier wall 1091 may be formed of a black matrix.

The barrier walls 1091, as illustrated in FIG. 3, may be provided to cover at least part of the first wiring 1020*a*. Accordingly, a periphery of each of the semiconductor light emitting devices included in the first and second groups may be surrounded by the barrier walls 1091. That is, the barrier walls 1091 (black matrixes) may be formed to surround each of the semiconductor light emitting devices included in the first and second groups.

The barrier walls 1091 may serve to separate semiconductor light emitting devices included in different groups. The barrier wall may have a reflection characteristic and simultaneously increase a contrast with respect to a color generated by the semiconductor light emitting device.

Further, as illustrated, a light diffusion layer 1070 may be stacked on one surface of the phosphor layer.

A light emitted from the semiconductor light emitting device is diffused though the light diffusion layer 1070.

Since the light emitted from the semiconductor light emitting device is diffused by the light diffusion layer 1070, even though only the light emitting devices included in one of the first and second groups emit light, it may seem that light is emitted overall from the vehicle lamps when viewed from outside. Therefore, when viewed from the outside, the light emitted from the one group may be viewed by being diffused by the light diffusion layer 1070, without viewed in the form of dots. Meanwhile, the light diffusion layer is not an essential component, and thus may be employed in or removed from the vehicle lamp disclosed herein, if necessary. Meanwhile, although not illustrated, in the vehicle lamp according to the present invention, the semiconductor light emitting devices included in the first group and the semiconductor light emitting devices included in the second group may be configured as devices emitting light of different colors.

That is, the semiconductor light emitting devices included in the first and second groups may emit light of different colors. In this instance, the phosphor layer may not be provided.

Figure 6:
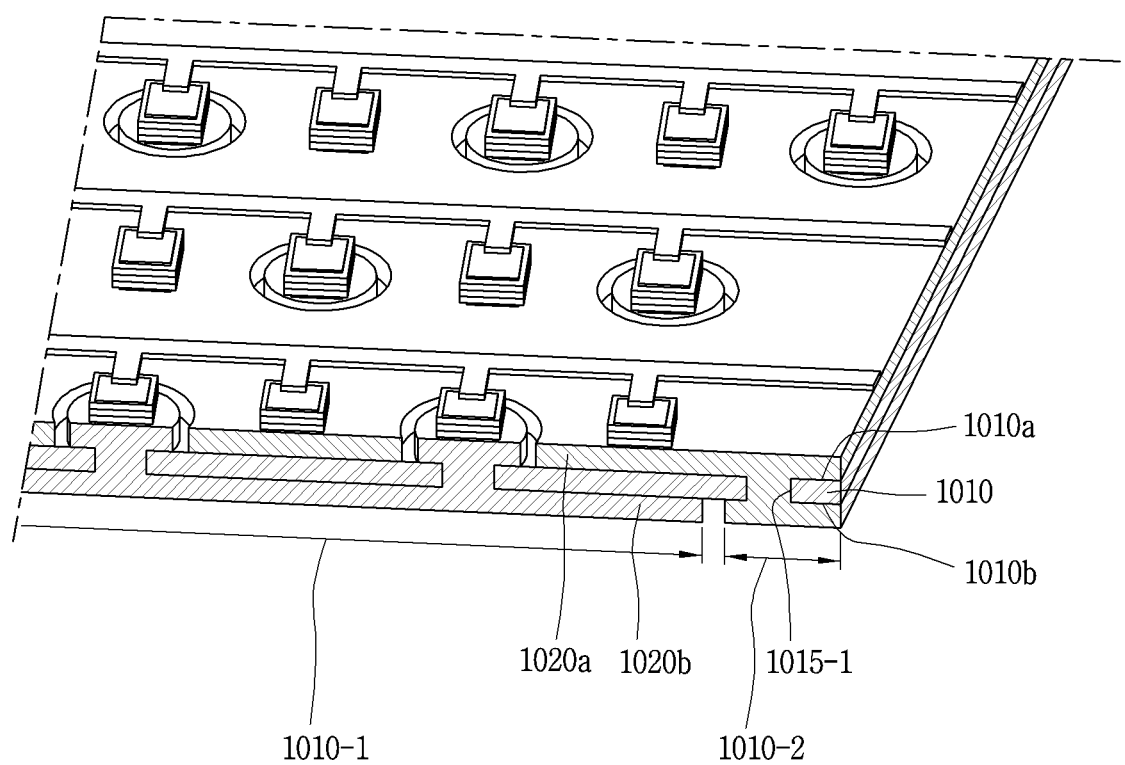
FIG. 6 is a conceptual view illustrating wirings of the vehicle lamp in accordance with the present invention.

As described above, the vehicle lamp according to the present invention may individually drive the semiconductor light emitting devices included in the plurality of groups for each group unit by forming different wirings on one surface and another surface of the wiring board. On the other hand, wirings formed on one surface and another surface of the wiring board must be electrically connected to a driving portion. Thus, the present invention proposes a wiring structure that can be connected to the driving portion with a simpler structure. Hereinafter, the structure will be described in more detail with reference to the accompanying drawings. FIG. 6 is a conceptual view illustrating wirings of the vehicle lamp according to the present invention.

As illustrated in FIG. 6, the wiring board 1010 includes one surface 1010*a* and another surface 1010*b* opposite to the one surface 1010*a*. The first wiring 1020*a* is disposed on the one surface 1010*a* of the wiring board 1010. The second wiring 1020*b* may be disposed on the another surface 1010*b* opposite to the one surface 1010*a* of the wiring board 1010 on which the first wiring 1020*a* is disposed.

At this time, the another surface 1010*b* of the wiring board 1010 may include a first region 1010-1 covered with the second wiring 1020*b* and a second region 1010-2 without being covered with the second wiring 1020*b*. That is, the second wiring 1020*b* may be disposed to cover only a part of the another surface 1010*b* of the wiring board 1010. At this time, the second region 1010-2 may be at least one edge region of the wiring board 1010.

A via hole 1015-1 may be formed in the at least one edge region 1010-2 of the wiring board 1010. The first wiring 1020*a* disposed on the one surface 1010*a* of the wiring board 1010 may extend to the another surface 1010*b* of the wiring board 1010 through the via hole 1015-1. Therefore, the first wiring 1020*a* may extend from the one surface 1010*a* of the wiring board 1010 to cover at least part of the second region 1010-2 formed on the another surface 1010*b* of the wiring board 1010. Accordingly, the first wiring and the second wiring may be located on the same surface of the wiring board 1010, so that the connection structure of the first and second wirings and the driving portion can be simplified.

Meanwhile, the vehicle lamp according to the present invention may further include a controller that controls an operation of each of the semiconductor light emitting devices included in the first and second groups. The controller may selectively turn on the semiconductor light emitting devices included in the first and second groups according to a stop mode, tail mode and turn mode of the vehicle. That is, in the vehicle lamp according to the present invention, the semiconductor light emitting devices located on the same surface can selectively be turned on according to the plurality of driving modes.

On the other hand, in the vehicle lamp according to the present invention, the semiconductor light emitting devices included in the first and second groups may be arranged at various positions on the wiring board. That is, in the present invention, through holes may be formed through the wiring board and the first wiring at the positions where the semiconductor light emitting devices included in the second group are to be arranged, and the semiconductor light emitting devices included in the second group may be arranged in the formed through holes.

The semiconductor light emitting devices included in the first and second groups can emit light of different colors. Therefore, such semiconductor light emitting devices included in different groups can be appropriately arranged according to a design to be realized.

Thus, in the embodiment described above, the structure in which the semiconductor light emitting devices included in the first and second groups are sequentially arranged alternately along the column direction and the row direction has been described.

Figure 7:
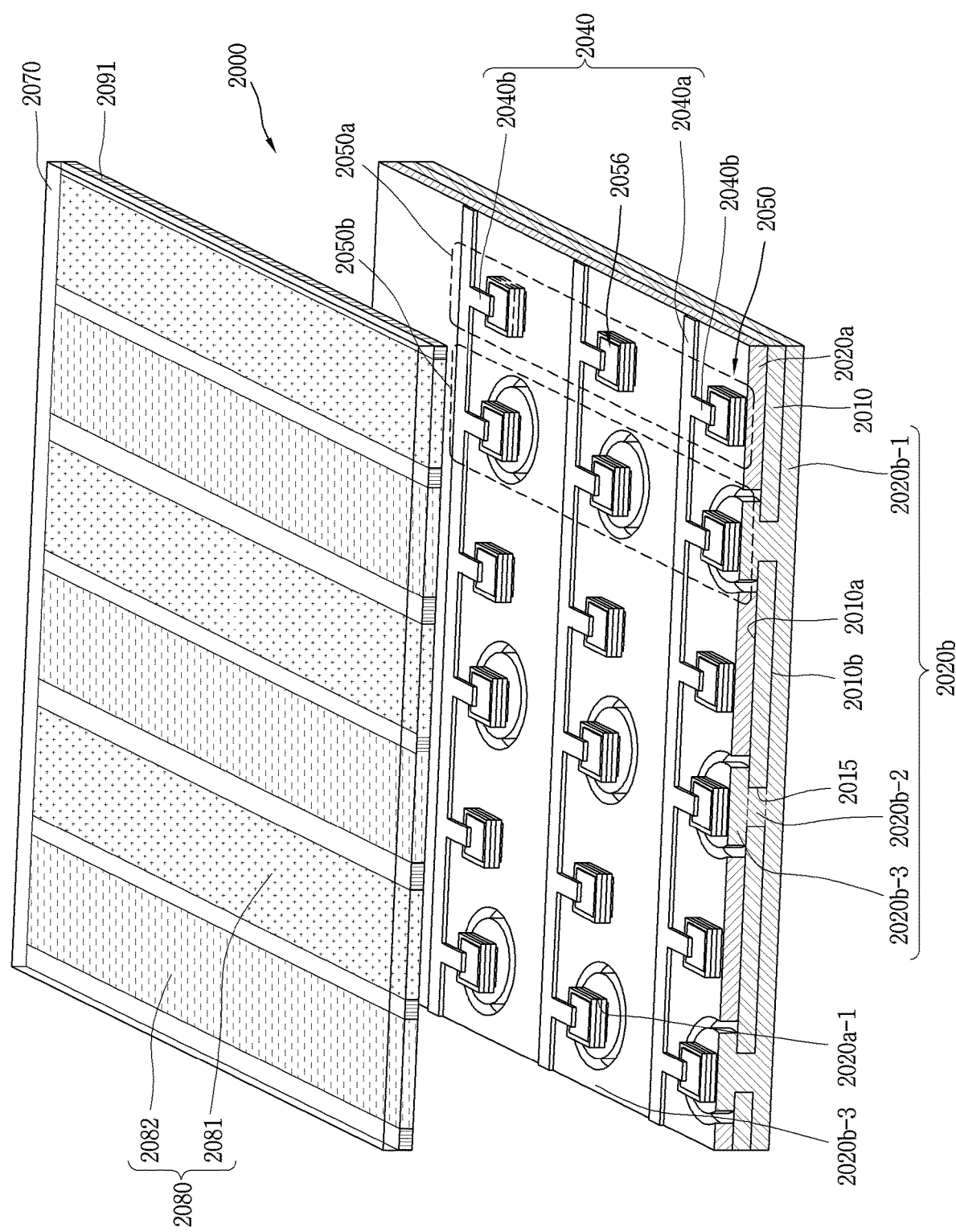
FIG. 7 is a perspective view illustrating a light source unit of a vehicle lamp in accordance with another embodiment of the present invention.
Figure 8:
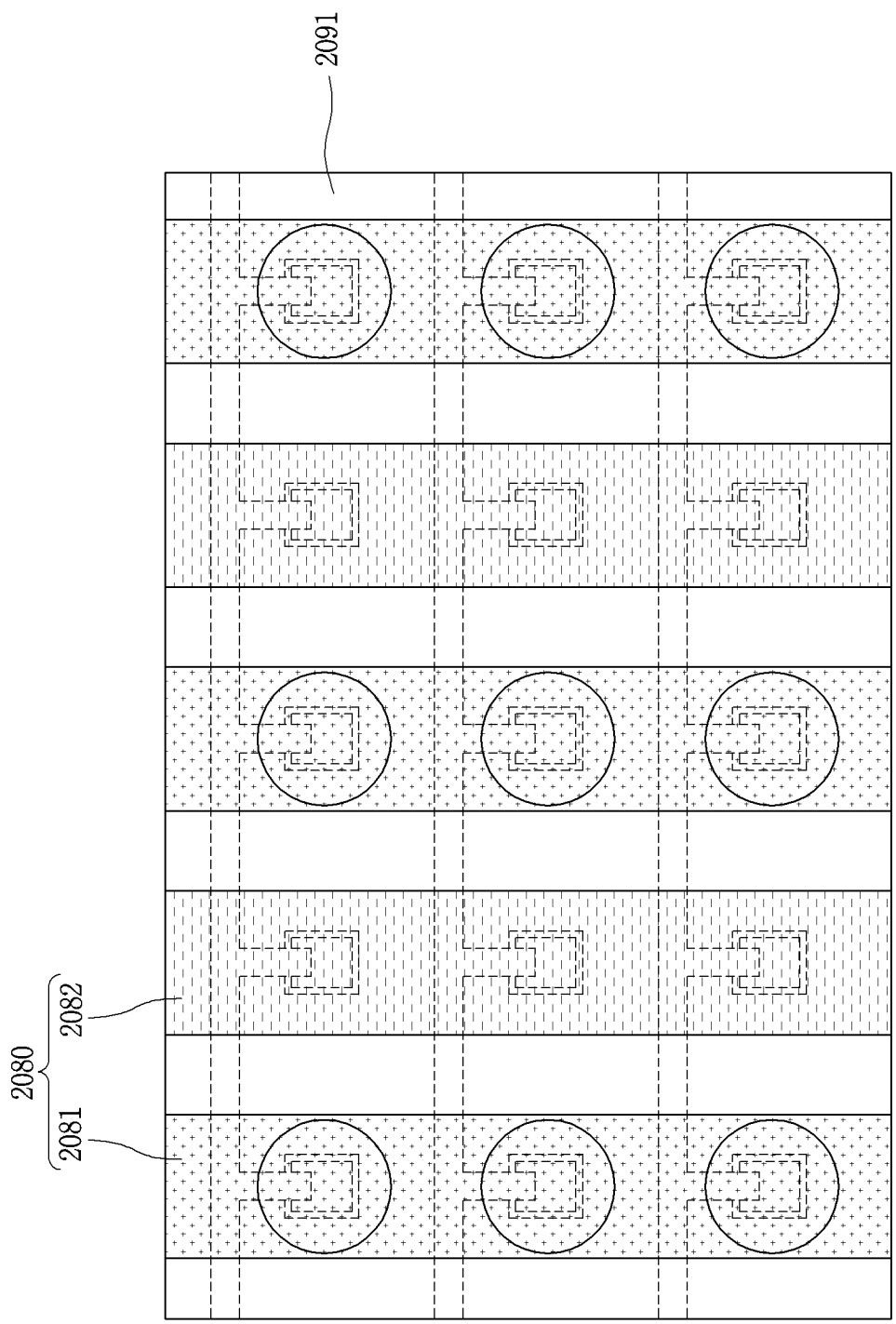
FIG. 8 is a conceptual view illustrating phosphor portions provided in the light source unit of the vehicle lamp in accordance with the another embodiment of the present invention.

Hereinafter, a method of arranging the semiconductor light emitting devices included in the first and second groups in a different manner will be described in more detail with reference to the accompanying drawings. FIG. 7 is a perspective view illustrating a light source unit of a vehicle lamp according to another embodiment of the present invention, and FIG. 8 is a conceptual view illustrating phosphor portions provided in the light source unit of the vehicle lamp according to the another embodiment of the present invention.

As illustrated in FIG. 7, semiconductor light emitting devices included in first and second groups may be disposed along one direction to form a plurality of lines. A first line formed by the semiconductor light emitting devices 2050*a* included in the first group and a second line formed by the semiconductor light emitting devices 2050*b* included in the second group may sequentially intersect with each other.

In this case, via holes 2015 formed in a wiring board 2010 and through holes 2010*a*-1 formed in a first wiring 2010*a* may be formed along the one direction. The via holes 2015 formed in the wiring substrate 2010 and the through holes 2010*a*-1 formed in the first wiring 2010*a* are formed at positions corresponding to arranged positions of the semiconductor light emitting devices 2050*b* included in the second group, so that the semiconductor light emitting devices 2050*b* included in the second group can be electrically connected to the second wiring 2020*b*.

Further, the first line formed by the semiconductor light emitting devices 2050*a* included in the first group and the second line formed by the semiconductor light emitting devices 2050*b* included in the second group are coated with different phosphor materials along the respective lines.

Also, a barrier wall 2091 may be formed between the first line formed by the semiconductor light emitting devices 2050*a* included in the first group and the second line formed by the semiconductor light emitting devices 2050*b* included in the second group.

In addition, the barrier wall 2091 may also be disposed between first and second phosphor portions 2081 and 2082. The barrier wall 2091 may be formed of a black matrix.

On the other hand, the method in which the semiconductor light emitting devices included in the first and second groups are electrically connected to the first and second wirings is the same as or similar to that illustrated in FIGS. 2 to 5, so detailed description thereof will be replaced with the above description.

As described above, according to a vehicle lamp of the present invention, semiconductor light emitting devices provided on one surface of a wiring board can be selectively connected to different wirings provided on both surfaces of the wiring board, respectively, thereby driving the semiconductor light emitting devices on the same surface in a two-channel manner. Therefore, according to the present invention, a vehicle lamp which can realize a plurality of colors of light on the same surface can be provided.

Further, according to a vehicle lamp of the present invention, wirings for electrically connecting semiconductor light emitting devices included in different groups to one surface and another surface of a wiring board, and the wiring provided on the another surface of the wiring board can be connected to the semiconductor light emitting devices through via holes. Therefore, the wirings can be simplified even without realizing a separate wiring pattern for the semiconductor light emitting devices included in different groups.

It should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A vehicle lamp comprising:
a light source unit to emit light, wherein the light source unit comprises:
a wiring board;
a plurality of semiconductor light emitting devices arranged on one surface of the wiring board;
a first wiring electrically connected to a first group of the plurality of semiconductor light emitting devices and disposed on the one surface of the wiring board;
a second wiring electrically connected to a second group of the plurality of semiconductor light emitting devices and extending to another surface of the wiring board through via holes formed through the wiring board; and
a third wiring electrically connected to the plurality of semiconductor light emitting devices included in the first and second groups, wherein the first wiring forms a surface electrode on the one surface of the wiring board, wherein the surface electrode is provided with through holes corresponding to the via holes, and wherein the semiconductor light emitting devices included in the second group are arranged in the through holes to be electrically connected to the second wiring.

2. The vehicle lamp of claim 1, wherein each of the plurality of semiconductor light emitting devices included in the first and second groups comprises:

first and second conductive semiconductor layers;

an active layer formed between the first and second conductive semiconductor layers;

a first conductive electrode formed on one surface of the first conductive semiconductor layer; and a second conductive electrode formed on one surface of the second conductive semiconductor layer, wherein the second conductive semiconductor layer is provided with one surface and another surface, the second conductive electrode formed on the one surface and the active layer formed on the another surface, wherein the first conductive electrode of each of the plurality of semiconductor light emitting devices included in the first group is electrically connected to the first wiring, and wherein the first conductive electrode of each of the plurality of semiconductor light emitting devices included in the second group is electrically connected to the second wiring.

3. The vehicle lamp of claim 2, wherein the second conductive electrode of each of the plurality of semiconductor light emitting devices included in the first and second groups is electrically connected to the third wiring forming the common electrode.

4. The vehicle lamp of claim 3, wherein the plurality of semiconductor light emitting devices included in the first and second groups form a plurality of rows in one direction, and wherein the third wiring is provided with a plurality of electrode lines formed to cover at least parts of the second conductive electrodes of the plurality of semiconductor light emitting devices included in the first and second groups, and extending along the one direction.

5. The vehicle lamp of claim 1, further comprising a phosphor layer formed to cover the plurality of semiconductor light emitting devices included in the first and second groups and configured to convert colors of light emitted from the plurality of semiconductor light emitting devices included in the first and second groups, wherein each of the plurality of semiconductor light emitting devices included in the first group is provided with a first phosphor portion stacked thereon and configured to convert a color of light emitted from each semiconductor light emitting device into a first color, and wherein each of the plurality of semiconductor light emitting devices included in the second group is provided with a second phosphor portion stacked thereon and configured to convert a color of light emitted from each semiconductor light emitting device to a second color different from the first color.

6. The vehicle lamp of claim 5, further comprising a black matrix disposed between the first and second phosphor portions, and wherein the black matrix is formed to cover at least part of the first wiring.

7. The vehicle lamp of claim 1, wherein the plurality of semiconductor light emitting devices included in the first group respectively are alternately arranged with the plurality of semiconductor light emitting devices included in the second group respectively along a row direction and a column direction.

8. The vehicle lamp of claim 7, further comprising a black matrix surrounding peripheries of the plurality of semiconductor light emitting devices included in the first and second groups.

9. The vehicle lamp of claim 1, wherein the another surface of the wiring board comprises a first region covered with the second wiring and a second region without being covered with the second wiring, and wherein the second region is at least one edge region of the wiring board.

10. The vehicle lamp of claim 9, wherein the first wiring extends from the one surface of the wiring board to cover at least part of the second region.

11. The vehicle lamp of claim 1, further comprising a controller configured to control driving of the plurality of semiconductor light emitting devices included in the first and second groups, and wherein the controller selectively turns on the plurality of semiconductor light emitting devices included in the first and second groups according to a stop mode, tail mode and turn mode of the vehicle.

* * * * *